(12) United States Patent
Drescher et al.

(10) Patent No.: US 11,056,561 B2
(45) Date of Patent: Jul. 6, 2021

(54) SILICIDED SOURCE/DRAIN TERMINALS FOR FIELD-EFFECT TRANSISTORS

(71) Applicant: GLOBALFOUNDRIES Dresden Module One Limited Liability Company & Co. KG., Dresden (DE)

(72) Inventors: Maximilian Ludwig Drescher, Dresden (DE); Violetta Sessi, Dresden (DE)

(73) Assignee: GLOBALFOUNDRIES DRESDEN MODULE ONE LIMITED LIABILITY COMPANY & CO. KG., Dresden (DE)

(*) Notice: Subject to any disclaimer, the term of this patent is extended or adjusted under 35 U.S.C. 154(b) by 0 days.

(21) Appl. No.: 16/704,607

(22) Filed: Dec. 5, 2019

(65) Prior Publication Data
US 2021/0175338 A1 Jun. 10, 2021

(51) Int. Cl.
*H01L 29/417* (2006.01)
*H01L 21/285* (2006.01)
*H01L 21/8234* (2006.01)
*H01L 29/45* (2006.01)
*H01L 27/092* (2006.01)

(52) U.S. Cl.
CPC .. *H01L 29/41725* (2013.01); *H01L 21/28518* (2013.01); *H01L 21/823418* (2013.01); *H01L 27/092* (2013.01); *H01L 29/45* (2013.01)

(58) Field of Classification Search
CPC ....... H01L 21/28518; H01L 21/823418; H01L 27/092; H01L 29/41725; H01L 29/45
See application file for complete search history.

(56) References Cited

U.S. PATENT DOCUMENTS

| | | | |
|---|---|---|---|
| 5,449,642 A | * | 9/1995 | Tan .................. H01L 21/28518 257/E21.165 |
| 7,332,388 B2 | | 2/2008 | Trivedi et al. |
| 7,550,808 B2 | | 6/2009 | Anderson et al. |
| 9,390,981 B1 | * | 7/2016 | Basker ................ H01L 21/8238 |
| 10,347,760 B2 | | 7/2019 | Baldauf et al. |
| 2007/0034906 A1 | * | 2/2007 | Wang .............. H01L 21/823814 257/224 |

(Continued)

OTHER PUBLICATIONS

Heinzig et al., "Reconfigurable Silicon Nanowire Transistors", Nano Lett. 2012, 12, 1, 119-124.

(Continued)

*Primary Examiner* — Herve-Louis Y Assouman
(74) *Attorney, Agent, or Firm* — Thompson Hine LLP; Anthony Canale

(57) ABSTRACT

Structures including field-effect transistors and methods of forming a structure including field-effect transistors. A first field-effect transistor includes a first source/drain terminal and a second source/drain terminal, and a second field-effect transistor includes a third source/drain terminal and a fourth source/drain terminal. The first source/drain terminal and the second source/drain terminal each include a fully-silicided section located at and above a top surface of a semiconductor layer. The third source/drain terminal and the fourth source/drain terminal each include a partially-silicided section located over the top surface of the semiconductor layer.

20 Claims, 6 Drawing Sheets

(56) References Cited

U.S. PATENT DOCUMENTS

2009/0001477 A1  1/2009  Hsu et al.
2013/0313524 A1  11/2013  De Micheli et al.

OTHER PUBLICATIONS

Knoll et al., "Inverters With Strained Si Nanowire Complementary Tunnel Field-Effect Transistors", IEEE Electron Device Letters, vol. 34, No. 6, Jun. 2013.
Knoch et al, "On the Performance of Single-Gated Ultrathin-Body SOI Schottky-Barrier MOSFETs", IEEE Transactions on Electron Devices, vol. 53, No. 7, Jul. 2006.

* cited by examiner

US 11,056,561 B2

SILICIDED SOURCE/DRAIN TERMINALS FOR FIELD-EFFECT TRANSISTORS

BACKGROUND

The present invention relates to semiconductor device fabrication and integrated circuits and, more specifically, to structures including field-effect transistors and methods of forming a structure including field-effect transistors.

Complementary-metal-oxide-semiconductor (CMOS) processes may be employed to build a combination of p-type and n-type field-effect transistors that are used as devices to construct, for example, logic cells. Field-effect transistors generally include a source, a drain, a body supplying a channel region between the source and drain, and a gate electrode overlapped with the channel region. When a control voltage exceeding a characteristic threshold voltage is applied to the gate electrode, carrier flow occurs in the channel region between the source and drain to produce a device output current.

The source and drain of n-type and p-type field-effect transistors are simultaneously silicided. The result is that the level of silicidation is identical for all transistors subjected to the silicidation process. For example, the sources and drains of all n-type and/or p-type transistors may be partially-silicided with an upper region of silicide and a lower region of semiconductor material. Conventional transistor fabrication processes lack the flexibility to provide some transistors on the same chip such sources and drains that are fully silicided in addition to those transistors having partially-silicided sources and drains.

Improved structures including field-effect transistors and methods of forming a structure including field-effect transistors are needed.

SUMMARY

In an embodiment of the invention, a structure includes a semiconductor layer having a top surface, a first field-effect transistor including a first source/drain terminal and a second source/drain terminal, and a second field-effect transistor including a third source/drain terminal and a fourth source/drain terminal. The first source/drain terminal and the second source/drain terminal each include a fully-silicided section located at and above the top surface of the semiconductor layer. The third source/drain terminal and the fourth source/drain terminal each include a partially-silicided section located over the top surface of the semiconductor layer.

In an embodiment of the invention, a method includes forming a first source/drain terminal and a second source/drain terminal of a first field-effect transistor that each include a first fully-silicided section located at and above a top surface of a semiconductor layer. The method further includes forming a third source/drain terminal and a fourth source/drain terminal of a second field-effect transistor that each include a first partially-silicided section located over the top surface of the semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
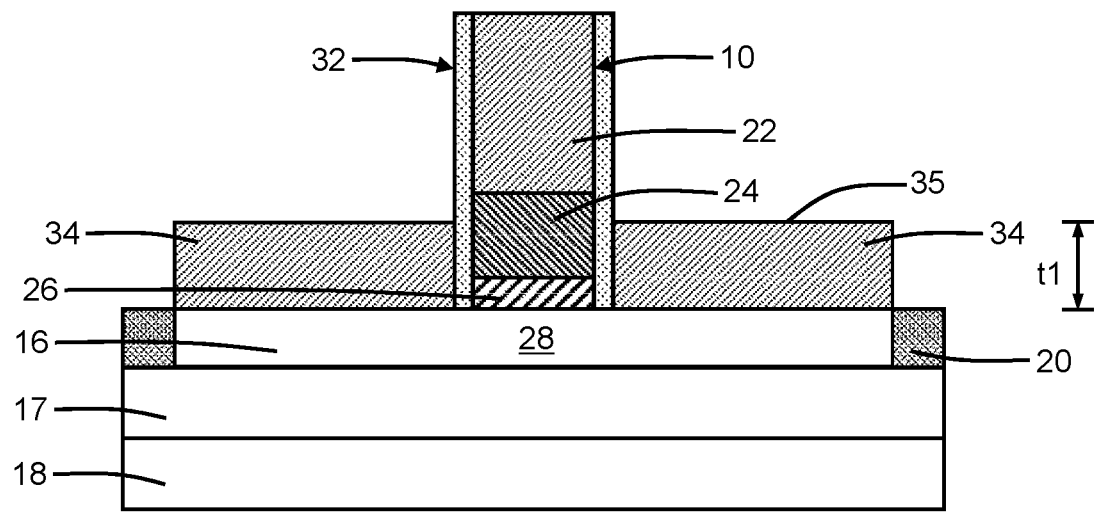
FIGS. 1, 1A, 1B are cross-sectional views of a structure at an initial fabrication stage of a processing method in accordance with embodiments of the invention.
Figure 1A:
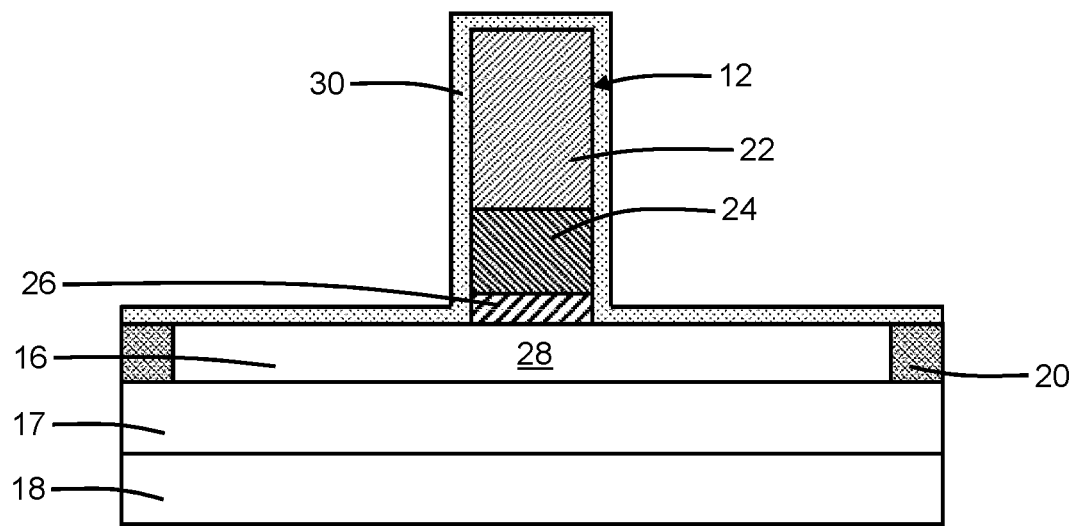
Figure 1B:
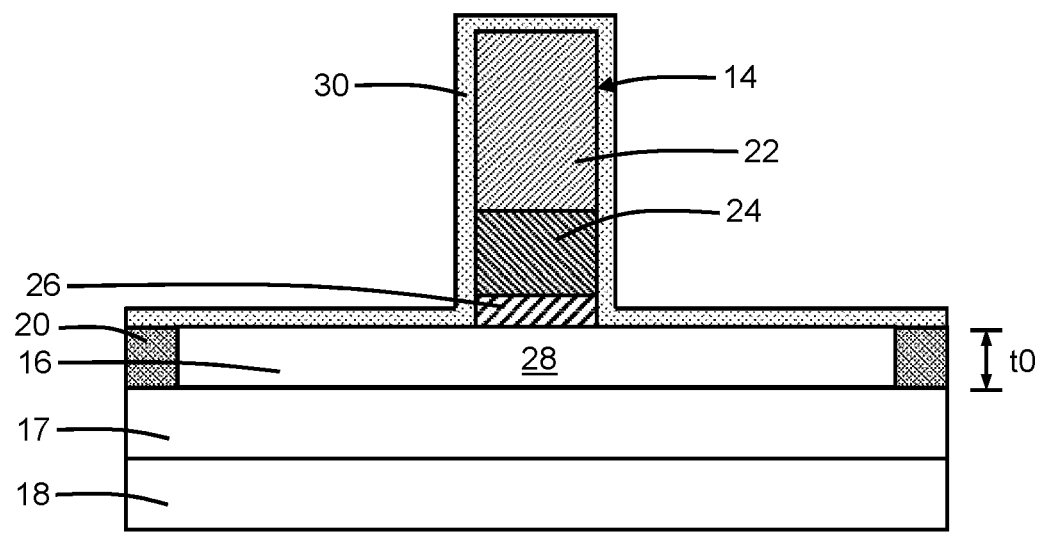

With reference to FIGS. 1, 1A, 1B and in accordance with embodiments of the invention, gate structures 10, 12, 14 are formed over different regions of a semiconductor layer 16. In an embodiment, the semiconductor layer 16 may be the device layer of a semiconductor-on-insulator (SOI) wafer, and the SOI wafer may further include a buried insulator layer 17 and a substrate 18. The semiconductor layer 16 is separated from the substrate 18 by the intervening buried insulator layer 17, and the semiconductor layer 16 may be considerably thinner than the substrate 18. The regions of the semiconductor layer 16 may be electrically isolated by shallow trench isolation regions 20 composed of dielectric material, such as silicon dioxide, that may extend through the semiconductor layer 16 to the buried insulator layer 17.

The semiconductor layer 16 and the substrate 18 may be composed of a single-crystal semiconductor material, such as single-crystal silicon, and the buried insulator layer 17 may be constituted by silicon dioxide of a buried oxide (BOX) layer. The semiconductor layer 16 has a thickness, t0. In an embodiment, the semiconductor layer 16 may have a thickness that ranges from about 3 nanometers (nm) to about 200 nm. In an embodiment, the SOI wafer may be an extremely thin semiconductor-on-insulator (ETSOI) wafer with a thin semiconductor layer 16 and a thin buried insulator layer 17, and the ETSOI wafer may be used to fabricate fully-depleted SOI (FDSOI) devices. In an embodiment, the semiconductor layer 16 of the ETSOI wafer may have a thickness in an ultra-thin regime (i.e., about 3 nm to about 10 nm).

Each of the gate structures 10, 12, 14 may include a layer 22 composed of a semiconductor material, such as polycrystalline silicon (i.e., polysilicon), a layer 24 composed of one or more metal gate materials, such as work function metals, and a layer 26 composed of a dielectric material, such as a high-k dielectric material like hafnium oxide. An additional thin layer of silicon dioxide may be located between the layer 26 and the top surface 15 of the semiconductor layer 16. The gate structures 10, 12, 14 may be formed by patterning a layer stack of the constituent materials of layers 22, 24, 26 with lithography and etching processes.

A channel region 28 is disposed beneath (i.e., at and below) the top surface 15 of the semiconductor layer 16 and, in particular, under each of the gate structures 10, 12, 14. The channel regions 28 may extend from the top surface 15 of the semiconductor layer 16 to the interface between the semiconductor layer 16 and the buried insulator layer 17. The channel regions 28 beneath the gate structures 12, 14 may be composed of the semiconductor material of the semiconductor layer 16, and the channel region 28 beneath the gate structure 10 may be composed of a different material, such as silicon-germanium, that locally replaces the semiconductor material of the semiconductor layer 16.

A dielectric layer 30 is deposited over all regions of the semiconductor layer 16. The dielectric layer 30 may be composed of a dielectric material, such as silicon nitride, that is conformally deposited. Sidewall spacers 32 are formed adjacent to the sidewalls of the gate structure 10 by etching the dielectric layer 30 while the dielectric layer 30 is masked by an etch mask in the regions of the semiconductor layer 16 including the gate structures 12, 14.

Raised source/drain regions 34 are formed adjacent to the opposite spacer-clad sidewalls of the gate structure 10. As used herein, the term "source/drain region" means a region of semiconductor material that can function as either a source or a drain of a field-effect transistor. The raised source/drain regions 34 have a top surface 35 and a thickness, t1, measured between the top surface 15 of the semiconductor layer 16 and the top surface 35, which provides their raised elevation.

The raised source/drain regions 34 may be provided by an epitaxial semiconductor layer that is coupled to the channel region 28 in the semiconductor layer 16 beneath the gate structure 10. In that regard, the raised source/drain regions 34 may be formed by the epitaxial growth of a layer of a semiconductor material from the top surface 15 of the semiconductor layer 16 adjacent to the sidewall spacers 32 on the opposite sides of the gate structure 10. The raised source/drain regions 34 may be in situ doped during epitaxial growth with a concentration of a dopant, such as a p-type dopant (e.g., boron) that provides p-type conductivity. The raised source/drain regions 34 may be grown by a selective epitaxial growth process in which the dielectric layer 30 does not support epitaxial growth. In an embodiment, the raised source/drain regions 34 may be composed of single-crystal silicon-germanium.

Figure 2:
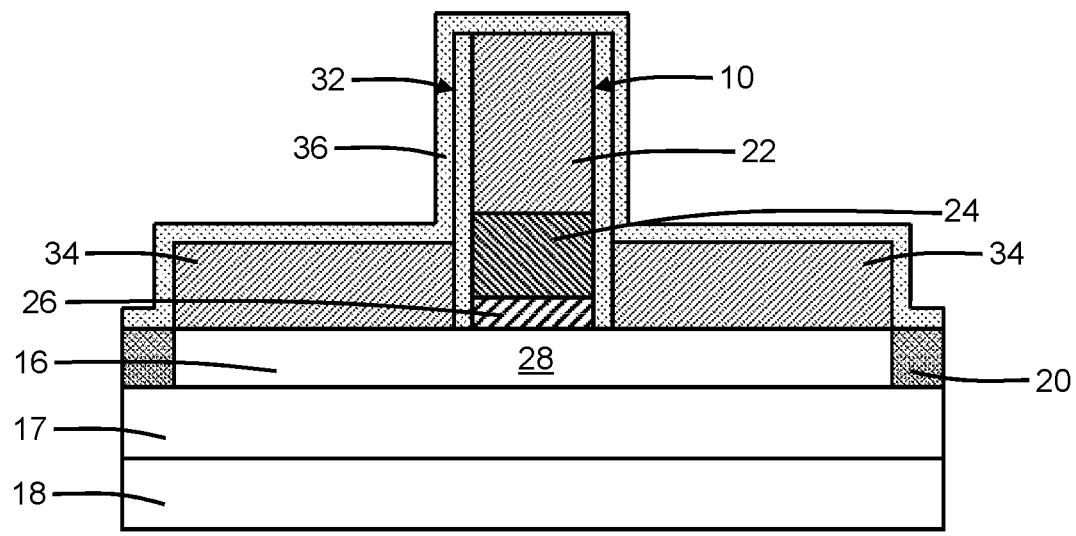
FIGS. 2, 2A, 2B are cross-sectional views of the structure at a fabrication stage subsequent to FIGS. 1, 1A, 1B.
Figure 2A:
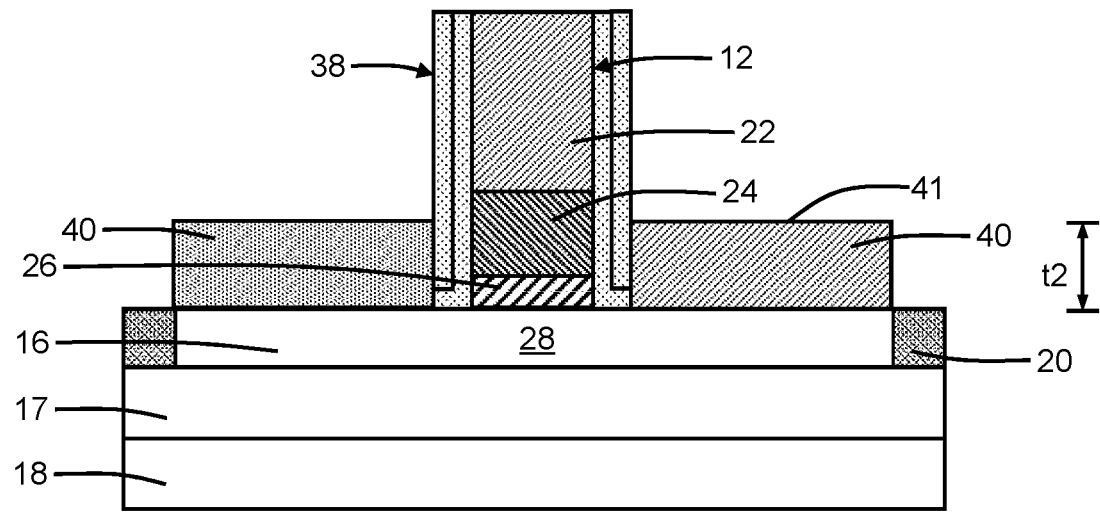
Figure 2B:
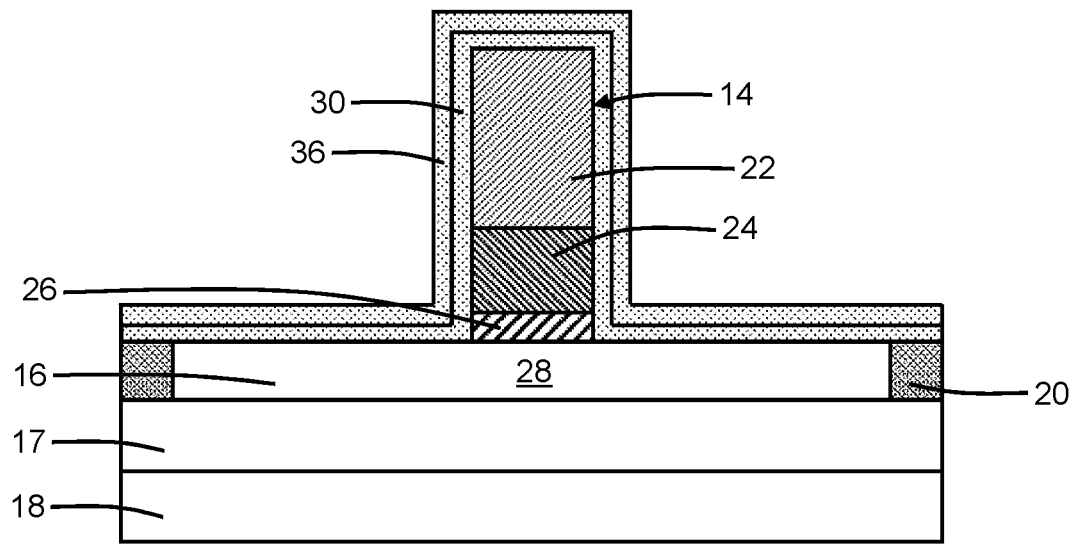

With reference to FIGS. 2, 2A, 2B in which like reference numerals refer to like features in FIGS. 1, 1A, 1B and at a subsequent fabrication stage, a dielectric layer 36 is deposited over all regions of the semiconductor layer 16. The dielectric layer 36 may be composed of a dielectric material, such as silicon nitride, that is conformally deposited. Sidewall spacers 38 are formed adjacent to the sidewalls of the gate structure 12 by etching the dielectric layers 30, 36 while the dielectric layer 36 is masked by an etch mask in the regions of the semiconductor layer 16 including the gate structures 10, 14.

Raised source/drain regions 40 are formed adjacent to the opposite spacer-clad sidewalls of the gate structure 12. The raised source/drain regions 40 have a top surface 41 and a thickness, t2, measured between the top surface of the semiconductor layer 16 and the top surface 41, which provides their raised elevation. The raised source/drain regions 40 may be provided by an epitaxial semiconductor layer that is coupled to the channel region 28 in the semiconductor layer 16 beneath the gate structure 12.

The raised source/drain regions 40 may be formed by the epitaxial growth of a layer of a semiconductor material from the top surface 15 of the semiconductor layer 16 adjacent to the sidewall spacers 38 on the opposite sides of the gate structure 12. The raised source/drain regions 40 may optionally be in situ doped during epitaxial growth with a concentration of a dopant, such as an n-type dopant (e.g., arsenic or phosphorus) that provides n-type conductivity. The raised source/drain regions 40 may be grown by a selective epitaxial growth process in which the dielectric layer 36 does not support epitaxial growth. In an embodiment, the raised source/drain regions 40 may be composed of single-crystal silicon.

Figure 3:
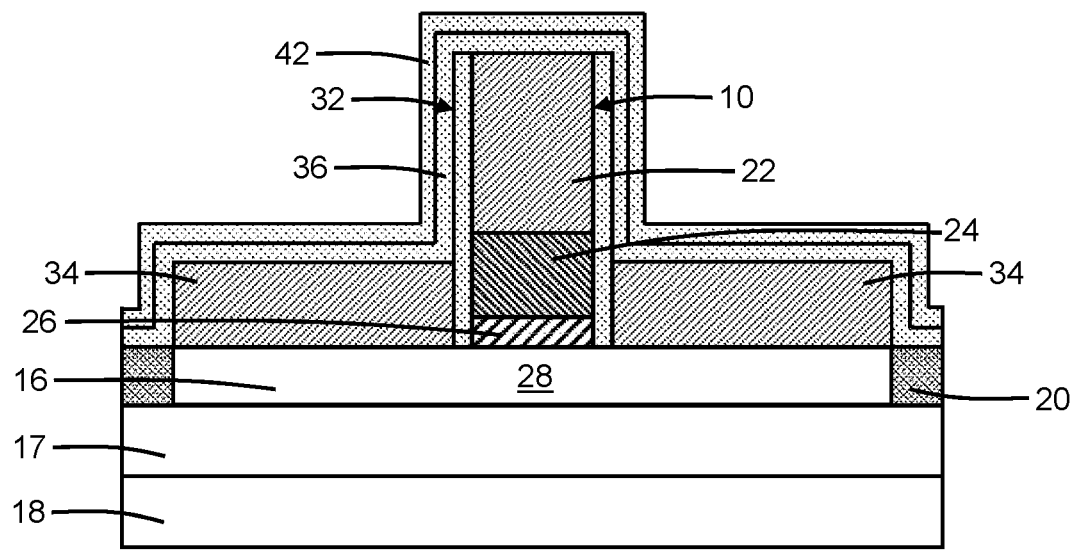
FIGS. 3, 3A, 3B are cross-sectional views of the structure at a fabrication stage subsequent to FIGS. 2, 2A, 2B.
Figure 3A:
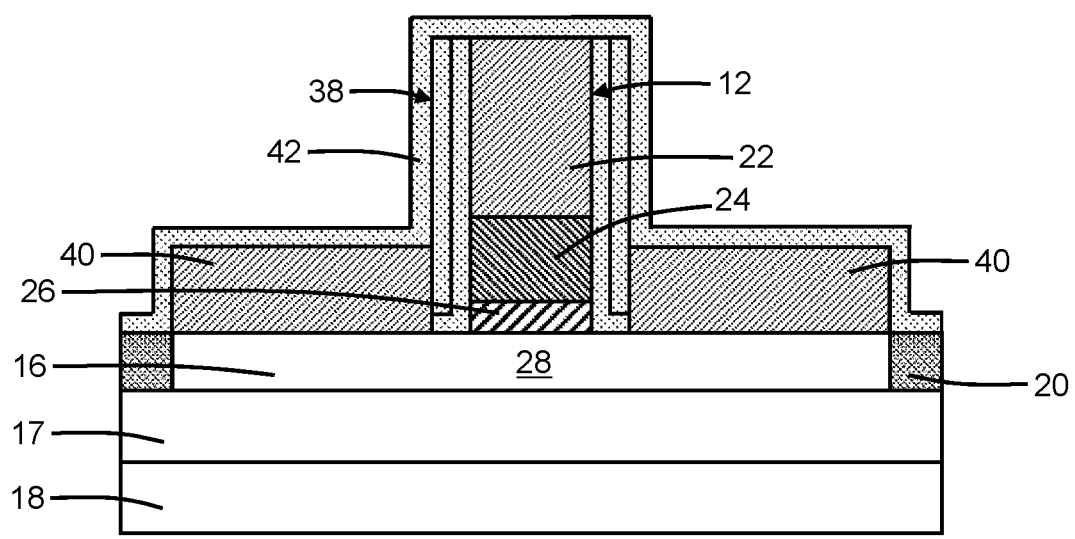
Figure 3B:
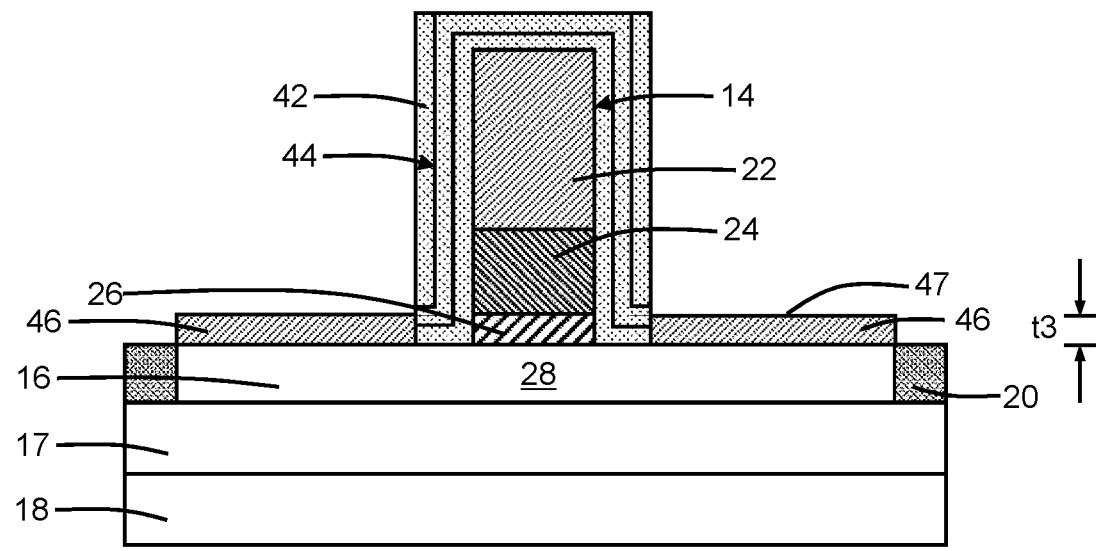

With reference to FIGS. 3, 3A, 3B in which like reference numerals refer to like features in FIGS. 2, 2A, 2B and at a subsequent fabrication stage, a dielectric layer 42 is deposited over all regions of the semiconductor layer 16. The dielectric layer 42 may be composed of a dielectric material, such as silicon nitride. Sidewall spacers 44 are formed adjacent to the sidewalls of the gate structure 14 by etching the dielectric layers 30, 36 while the dielectric layer 42 is masked by an etch mask in the regions of the semiconductor layer 16 including the gate structures 10, 12.

Raised source/drain regions 46 are formed adjacent to the opposite spacer-clad sidewalls of the gate structure 14. The raised source/drain regions 46 have a top surface 47 and a thickness, t3, measured between the top surface of the semiconductor layer 16 and the top surface 47, which provides their raised elevation. The raised source/drain regions 46 may be provided by an epitaxial semiconductor layer that is coupled to the channel region 28 in the semiconductor layer 16 beneath the gate structure 14.

The raised source/drain regions 46 may be formed by the epitaxial growth of a layer of a semiconductor material from the top surface 15 of the semiconductor layer 16 adjacent to the sidewall spacers 44 on the opposite sides of the gate structure 14. The raised source/drain regions 46 may optionally be in situ doped during epitaxial growth with a concentration of a dopant, such as an n-type dopant (e.g., arsenic or phosphorus) that provides n-type conductivity. The raised source/drain regions 46 may be grown by a selective epitaxial growth process in which the dielectric layer 42 does not support epitaxial growth. In an embodiment, the raised source/drain regions 46 may be composed of single-crystal silicon.

The thickness of the raised source/drain regions 34 is greater than the thickness of the raised source/drain regions 46. Similarly, the thickness of the raised source/drain regions 40 is also greater than the thickness of the raised source/drain regions 46. The thicknesses of the raised source/drain regions 34 and the raised source/drain regions 40 may be equal or unequal. In an embodiment, the raised source/drain regions 46 and the raised source/drain regions 40 may be composed of the same semiconductor material. In an embodiment, the raised source/drain regions 34 may be composed of a different semiconductor material than the raised source/drain regions 46 and the raised source/drain regions 40. The raised source/drain regions 34, 40, 46 are all elevated or raised relative to the top surface 15 of the semiconductor layer 16.

The raised source/drain regions 34 and gate structure 10 constitute elements of a field-effect transistor 48, the raised source/drain regions 40 and gate structure 12 constitute elements of a field-effect transistor 50, and the raised source/drain regions 46 and gate structure 14 constitute elements of a field-effect transistor 52. The field-effect transistors 48, 50, 52 are all formed using the SOI wafer and may be electronic components included in a single chip scribed from the SOI wafer, and all of the raised source/drain regions 34, 40, 46 project in a vertical direction from the same top surface 15. In an embodiment, the field-effect transistor 48 may be a p-type field-effect transistor, and the field-effect transistors 50, 52 may be n-type field-effect transistors. Alternatively, one or more of the field-effect transistors 48, 50, 52 may be ambipolar field-effect transistors.

Figure 4:
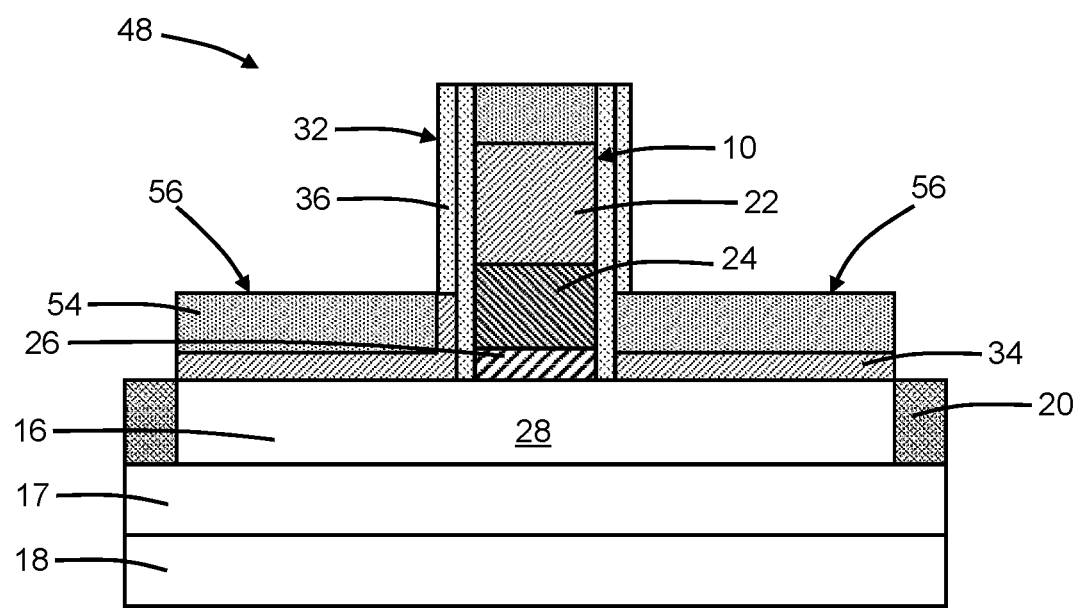
FIGS. 4, 4A, 4B are cross-sectional views of the structure at a fabrication stage subsequent to FIGS. 3, 3A, 3B.
Figure 4A:
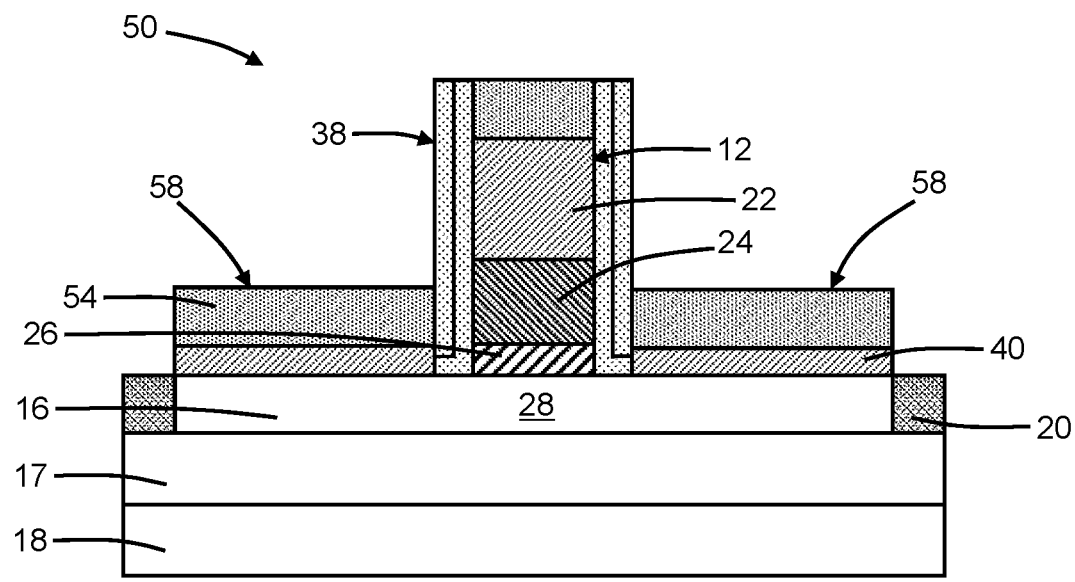
Figure 4B:
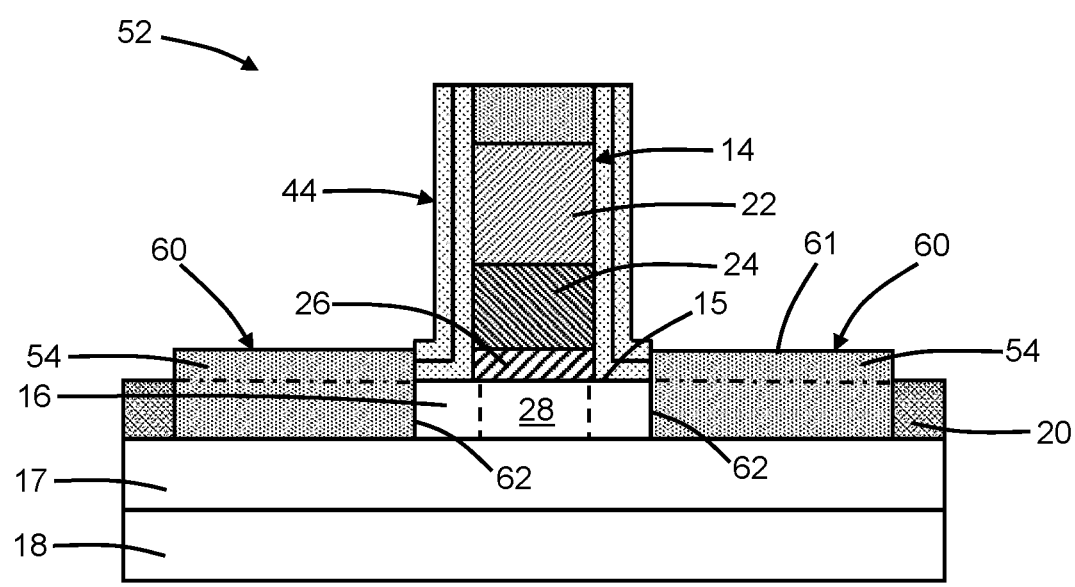

With reference to FIGS. 4, 4A, 4B in which like reference numerals refer to like features in FIGS. 3, 3A, 3B and at a subsequent fabrication stage, the dielectric layer 42 may be removed from all regions of the semiconductor layer 16 with an etching process. Sections of a silicide layer 54 are subsequently formed using the respective semiconductor materials of the raised source/drain regions 34, the raised source/drain regions 40, and the raised source/drain regions 46, as well as the portion of the channel region 28 associated with the field-effect transistor 52. Sections of the silicide layer 54 are also formed using the semiconductor material of the layer 22 of the gate structures 10, 12, 14.

The silicide layer 54 may be formed by a silicidation process in which a layer of a silicide-forming metal is deposited by, for example, chemical vapor deposition or physical vapor deposition over the different regions of the semiconductor layer 16 followed by one or more annealing processes (e.g., rapid thermal annealing). During annealing, a silicide phase formed by reacting the layer of silicide-forming metal and the contacted semiconductor materials of the raised source/drain regions 34, the raised source/drain regions 40, the raised source/drain regions 46, and the layer 22 of the gate structures 10, 12, 14. Candidate materials for the silicide-forming metal include, but are not limited to, nickel, titanium, cobalt, palladium, platinum, or other metals capable of reacting with silicon to form a low-resistivity, thermally-stable silicide. Residual silicide-forming metal that remains after forming the sections of the silicide layer 54 may be removed by wet chemical etching. The silicidation process is self-aligned because the silicide-forming metal does not react with dielectric materials.

In an embodiment, the raised source/drain regions 34 of the field-effect transistor 48 and the raised source/drain regions 40 of the field-effect transistor 50 are both partially silicided to define respective partially-silicided source/drain terminals 56, 58, and the raised source/drain regions 46 of the field-effect transistor 52 are fully silicided to define respective fully-silicided source/drain terminals 60. The ability to concurrently provide both fully-silicided source/drain terminals 60 and partially-silicided source/drain terminals 56, 58 originates from the smaller thickness of the epitaxial semiconductor material of the raised source/drain regions 46 in comparison with the thicknesses of the epitaxial semiconductor material of the raised source/drain regions 34 and the epitaxial semiconductor material of the raised source/drain regions 40. The same silicide-forming metal deposition and the same annealing processes are used in parallel during the silicidation process to form all of the sections of the silicide layer 54 included in the source/drain terminals 56, 58, 60.

Each partially-silicided source/drain terminal 56 of the field-effect transistor 48 formed using the raised source/drain regions 34 includes a section of the silicide layer 54 and a residual portion of the single-crystal epitaxial semiconductor material of the raised source/drain region 34 beneath the section of the silicide layer 54. Each partially-silicided source/drain terminal 58 of the field-effect transistor 50 formed using the raised source/drain regions 40 includes a section of the silicide layer 54 and a residual portion of the single-crystal epitaxial semiconductor material of the raised source/drain region 40 beneath the section of the silicide layer 54. The interface between the silicide layer 54 and the single-crystal epitaxial semiconductor material of the raised source/drain regions 34 and the interface between the silicide layer 54 and the single-crystal epitaxial semiconductor material of the raised source/drain regions 40 are each above (i.e., over) the top surface 15 of the semiconductor layer 16. The elevated locations of these interfaces reflect that the silicidation process does not reach the single-crystal semiconductor material of the channel regions 28 beneath the raised source/drain regions 34 or the raised source/drain regions 40. The partially-silicided source/drain terminals 56, 58 include partially-silicided raised sections that are arranged fully above the top surface 15 of the semiconductor layer 16. The sections of the single-crystal epitaxial semiconductor material of the raised source/drain regions 34, 40 are located between the sections of the silicide layer 54 and the top surface 15 of the semiconductor layer 16.

Each fully-silicided source/drain terminal 60 of the field-effect transistor 52 formed using the raised source/drain regions 46 includes sections of the silicide layer 54 that extend to the buried insulator layer 17. The single-crystal epitaxial semiconductor material of the raised source/drain regions 46 and respective sections of the semiconductor layer 16 in the channel region 28 beneath the raised source/drain regions 46 are silicided to form lower sections of the fully-silicided source/drain terminals 60 and the raised source drain/regions 46 are silicided to former upper sections of the fully-silicided source/drain terminals 60. In that regard, the total thickness of the semiconductor layer 16 and the raised source/drain regions 46 may be less than the thickness of either the raised source/drain regions 34 or the raised source/drain regions 40. In addition, the doping of the raised source/drain regions 46 may be used to control the silicidation process.

The fully-silicided source/drain terminals 60 include fully-silicided raised sections that are located at and above the top surface 15 of the semiconductor layer 16, as well as fully-silicided sections that are located at and below the top surface 15 of the semiconductor layer 16 and that extend fully from the top surface 15 to the buried insulator layer 17. The different sections of the fully-silicided source/drain terminals 60 are diagrammatically indicated by the dot-dashed lines in FIG. 4B. The different fully-silicided sections of each fully-silicided source/drain terminal 60 are continuous and are provided by a single, unitary section of the silicide layer 54. The fully-silicided raised section of each fully-silicided source/drain terminal 60, which are formed from the raised source/drain regions 46, projects upward and away from the top surface 15 of the semiconductor layer 16 to a top surface 61.

The sections of the fully-silicided source/drain terminals 60 beneath the top surface 15 of the semiconductor layer 16 have respective interfaces with the single-crystal semiconductor material of the channel region 28. These interfaces may define Schottky junctions 62 between the fully-silicided source/drain terminals 60 and the channel region 28 of the field-effect transistor 52. Each Schottky junction 62 is a metal-semiconductor junction in which the metal of the respective fully-silicided source/drain terminal 60 is in direct contact with the semiconductor material of the channel region 28. Each Schottky junction 62 extends in a vertical direction from the buried insulator layer 17 to the top surface 15 of the semiconductor layer 16. In alternative embodiments, the fully-silicided source/drain terminals 60 may extend laterally into the portion of the channel region 28 beneath the sidewall spacers 44 and may also further extend into the portion of the channel region 28 beneath gate structure 14, which would reposition the Schottky junctions 62 as indicated by the dashed lines in FIG. 4B.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor layer having a top surface;
   a first field-effect transistor including a first source/drain terminal and a second source/drain terminal, the first source/drain terminal and the second source/drain terminal each including a first fully-silicided section located at and above the top surface of the semiconductor layer and a second fully-silicided section located at and below the top surface of the semiconductor layer; and
   a second field-effect transistor including a third source/drain terminal and a fourth source/drain terminal, the third source/drain terminal and the fourth source/drain terminal each including a first partially-silicided section located above the top surface of the semiconductor layer.

2. The structure of claim 1 wherein the first field-effect transistor includes a channel region beneath the top surface of the semiconductor layer and a gate structure over the channel region, the second fully-silicided section of the first source/drain terminal defines a first Schottky junction with the channel region, and the second fully-silicided section of the second source/drain terminal defines a second Schottky junction with the channel region.

3. The structure of claim 2 wherein the semiconductor layer is a device layer of a semiconductor-on-insulator wafer, the semiconductor-on-insulator wafer includes a substrate and a buried insulator layer positioned between the substrate and the device layer, and the second fully-silicided section of the first source/drain terminal and the second fully-silicided section of the second source/drain terminal each extend from the top surface of the semiconductor layer to the buried insulator layer.

4. The structure of claim 1 wherein the first fully-silicided section comprises a first section of a silicide layer, and the second fully-silicided section comprises a second section of the silicide layer.

5. The structure of claim 4 wherein the third source/drain terminal and the fourth source/drain terminal each include a third section of the silicide layer and a section of semiconductor material separating the third section of the silicide layer from the top surface of the semiconductor layer.

6. The structure of claim 1 wherein the semiconductor layer is a device layer of a semiconductor-on-insulator wafer, the semiconductor-on-insulator wafer includes a substrate and a buried insulator layer positioned between the substrate and the device layer, and the second fully-silicided section of the first source/drain terminal and the second fully-silicided section of the second source/drain terminal each extend fully through the semiconductor layer to the buried insulator layer.

7. The structure of claim 1 wherein the first partially-silicided section of the third source/drain terminal and the first partially-silicided section of the fourth source/drain terminal are each fully located above the top surface of the semiconductor layer.

8. The structure of claim 1 wherein the first field-effect transistor is a p-type field-effect transistor, an n-type field-effect transistor, or an ambipolar field-effect transistor, and the second field-effect transistor is an n-type field-effect transistor.

9. The structure of claim 1 wherein the first fully-silicided section of the first source/drain terminal comprises a first section of a silicide layer, the first fully-silicided section of the second source/drain terminal comprises a second section of the silicide layer, and the first partially-silicided section of the third source/drain terminal includes a third section of the silicide layer, and the first partially-silicided section of the fourth source/drain terminal includes a fourth section of the silicide layer.

10. The structure of claim 9 wherein the third source/drain terminal includes a first section of semiconductor material separating the third section of the silicide layer from the top surface of the semiconductor layer, and the fourth source/drain terminal includes a second section of semiconductor material separating the fourth section of the silicide layer from the top surface of the semiconductor layer.

11. A structure comprising:
    a semiconductor layer having a top surface;
    a first field-effect transistor including a first source/drain terminal and a second source/drain terminal, the first source/drain terminal and the second source/drain terminal each including a first fully-silicided section located at and above the top surface of the semiconductor layer;
    a second field-effect transistor including a third source/drain terminal and a fourth source/drain terminal, the third source/drain terminal and the fourth source/drain terminal each including a first partially-silicided section located above the top surface of the semiconductor layer; and a third field-effect transistor including a fifth source/drain terminal and a sixth source/drain terminal, the fifth source/drain terminal and the sixth source/drain terminal each including a second partially-silicided section located above the top surface of the semiconductor layer, wherein the first field-effect transistor is a p-type field-effect transistor, an n-type field-effect transistor, or an ambipolar field-effect transistor, the second field-effect transistor is a p-type field-effect transistor, and the third field-effect transistor is an n-type field-effect transistor.

12. A method comprising:

forming a first source/drain terminal and a second source/drain terminal of a first field-effect transistor that each include a first fully-silicided section located at and above a top surface of a semiconductor layer; and forming a third source/drain terminal and a fourth source/drain terminal of a second field-effect transistor that each include a first partially-silicided section located above the top surface of the semiconductor layer, wherein the first fully-silicided section of the first source/drain terminal comprises a first section of a silicide layer, the first fully-silicided section of the second source/drain terminal comprises a second section of the silicide layer, and the first partially-silicided section of the third source/drain terminal includes a third section of the silicide layer, and the first partially-silicided section of the fourth source/drain terminal includes a fourth section of the silicide layer.

13. The structure of claim 1 wherein the first fully-silicided section of the first source/drain terminal and the first fully-silicided section of the second source/drain terminal each project away from the top surface of the semiconductor layer.

14. The structure of claim 13 wherein the first field-effect transistor includes a channel region beneath the top surface of the semiconductor layer and a gate structure over the channel region, and the gate structure is positioned laterally between the first fully-silicided section of the first source/drain terminal and the first fully-silicided section of the second source/drain terminal.

15. The method of claim 12 wherein the third source/drain terminal includes a first section of semiconductor material separating the third section of the silicide layer from the top surface of the semiconductor layer, and the fourth source/drain terminal includes a second section of semiconductor material separating the fourth section of the silicide layer from the top surface of the semiconductor layer.

16. The method of claim 12 wherein the first fully-silicided section of the first source/drain terminal, the first fully-silicided section of the second source/drain terminal, the first partially-silicided section of the third source/drain terminal, and the first partially-silicided section of the fourth source/drain terminal are concurrently formed by a silicidation process.

17. The method of claim 12 wherein forming the first source/drain terminal and the second source/drain terminal of the first field-effect transistor comprises:

epitaxially growing a first semiconductor material from the top surface of the semiconductor layer with a first epitaxial growth process to define a first raised source/drain region and a second raised source/drain region; and fully siliciding the first raised source/drain region and the second raised source/drain region with a silicidation process.

18. The method of claim 17 wherein forming the third source/drain terminal and the fourth source/drain terminal of the second field-effect transistor comprises:

epitaxially growing a second semiconductor material from the top surface of the semiconductor layer with a second epitaxial growth process to define a third raised source/drain region and a fourth raised source/drain region; and covering the third raised source/drain region and the fourth raised source/drain region with a dielectric layer during the first epitaxial growth process.

19. The method of claim 18 wherein forming the third source/drain terminal and the fourth source/drain terminal of the second field-effect transistor further comprises:

partially siliciding the third raised source/drain region and the fourth raised source/drain region with the silicidation process.

20. The method of claim 18 wherein the first raised source/drain region and the second raised source/drain region each have a first thickness, and the third raised source/drain region and the fourth raised source/drain region each has a second thickness that is greater than the first thickness.

* * * * *